United States Patent
Eppich et al.

(10) Patent No.: US 7,253,053 B2
(45) Date of Patent: Aug. 7, 2007

(54) METHODS OF FORMING TRANSISTOR DEVICES AND CAPACITOR CONSTRUCTIONS

(75) Inventors: Denise M. Eppich, Boise, ID (US); Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 10/757,253

(22) Filed: Jan. 13, 2004

(65) Prior Publication Data

US 2004/0178432 A1 Sep. 16, 2004

Related U.S. Application Data

(62) Division of application No. 10/388,103, filed on Mar. 12, 2003.

(51) Int. Cl.
*H01L 21/8242* (2006.01)
(52) U.S. Cl. .................... 438/244; 438/253; 438/396; 438/630; 438/649
(58) Field of Classification Search ............... 428/239, 428/240, 244, 253, 299, 301, 386, 393, 396, 428/398, 630, 649; 257/288, 303, 306, 310, 257/751, 754
See application file for complete search history.

(56) References Cited

U.S. PATENT DOCUMENTS

| | | | |
|---|---|---|---|
| 5,705,428 A | 1/1998 | Liu et al. | |
| 6,214,724 B1 | 4/2001 | Nakajima | 438/656 |
| 6,228,702 B1 | 5/2001 | Hirota | |
| 6,255,698 B1 | 7/2001 | Gardner et al. | |
| 6,277,702 B1* | 8/2001 | Chun et al. | 438/396 |
| 6,297,539 B1 | 10/2001 | Ma et al. | 257/410 |
| 6,306,743 B1 | 10/2001 | Lee | |
| 6,319,832 B1* | 11/2001 | Uhlenbrock et al. | 438/681 |
| 6,436,749 B1 | 8/2002 | Tonti et al. | |
| 6,573,160 B2 | 6/2003 | Taylor, Jr. et al. | |
| 6,600,212 B2 | 7/2003 | Takayanagi et al. | |
| 6,617,210 B1* | 9/2003 | Chau et al. | 438/240 |
| 6,693,333 B1 | 2/2004 | Yu | |
| 6,740,901 B2 | 5/2004 | Miki et al. | |
| 6,794,232 B2* | 9/2004 | Zheng et al. | 438/186 |
| 2001/0024387 A1 | 9/2001 | Raaijmakers et al. | |
| 2001/0052618 A1 | 12/2001 | Hasegawa | |

(Continued)

FOREIGN PATENT DOCUMENTS

JP 10 303412 11/1998

(Continued)

*Primary Examiner*—Hsien-Ming Lee
(74) *Attorney, Agent, or Firm*—Wells St. John P.S.

(57) ABSTRACT

The invention includes methods of forming circuit devices. A metal-containing material comprising a thickness of no more than 20 Å (or alternatively comprising a thickness resulting from no more than 70 ALD cycles) is formed between conductively-doped silicon and a dielectric layer. The conductively-doped silicon can be n-type silicon and the dielectric layer can be a high-k dielectric material. The metal-containing material can be formed directly on the dielectric layer, and the conductively-doped silicon can be formed directly on the metal-containing material. The circuit device can be a capacitor construction or a transistor construction. If the circuit device is a transistor construction, such can be incorporated into a CMOS assembly. Various devices of the present invention can be incorporated into memory constructions, and can be incorporated into electronic systems.

21 Claims, 6 Drawing Sheets

U.S. PATENT DOCUMENTS

| | | |
|---|---|---|
| 2002/0014649 A1 | 2/2002 | Kunikiyo |
| 2002/0024080 A1 | 2/2002 | Derderian et al. |
| 2002/0053711 A1 | 5/2002 | Chau et al. |
| 2002/0086507 A1 | 7/2002 | Park et al. |
| 2002/0153573 A1 | 10/2002 | Mogami |
| 2003/0129793 A1 | 7/2003 | Chau et al. |
| 2003/0199139 A1 | 10/2003 | Lee |
| 2003/0207528 A1 | 11/2003 | Li |
| 2004/0038538 A1 | 2/2004 | Ho et al. |
| 2004/0065903 A1 | 4/2004 | Zheng et al. |
| 2005/0064653 A1 | 3/2005 | Park et al. |
| 2005/0104112 A1 | 5/2005 | Haukka et al. |
| 2005/0269618 A1 | 12/2005 | Shin et al. |

FOREIGN PATENT DOCUMENTS

| | | |
|---|---|---|
| JP | 2001 339061 | 12/2001 |
| JP | 2003 023152 | 1/2003 |
| WO | 2004/006584 | 3/2004 |

* cited by examiner

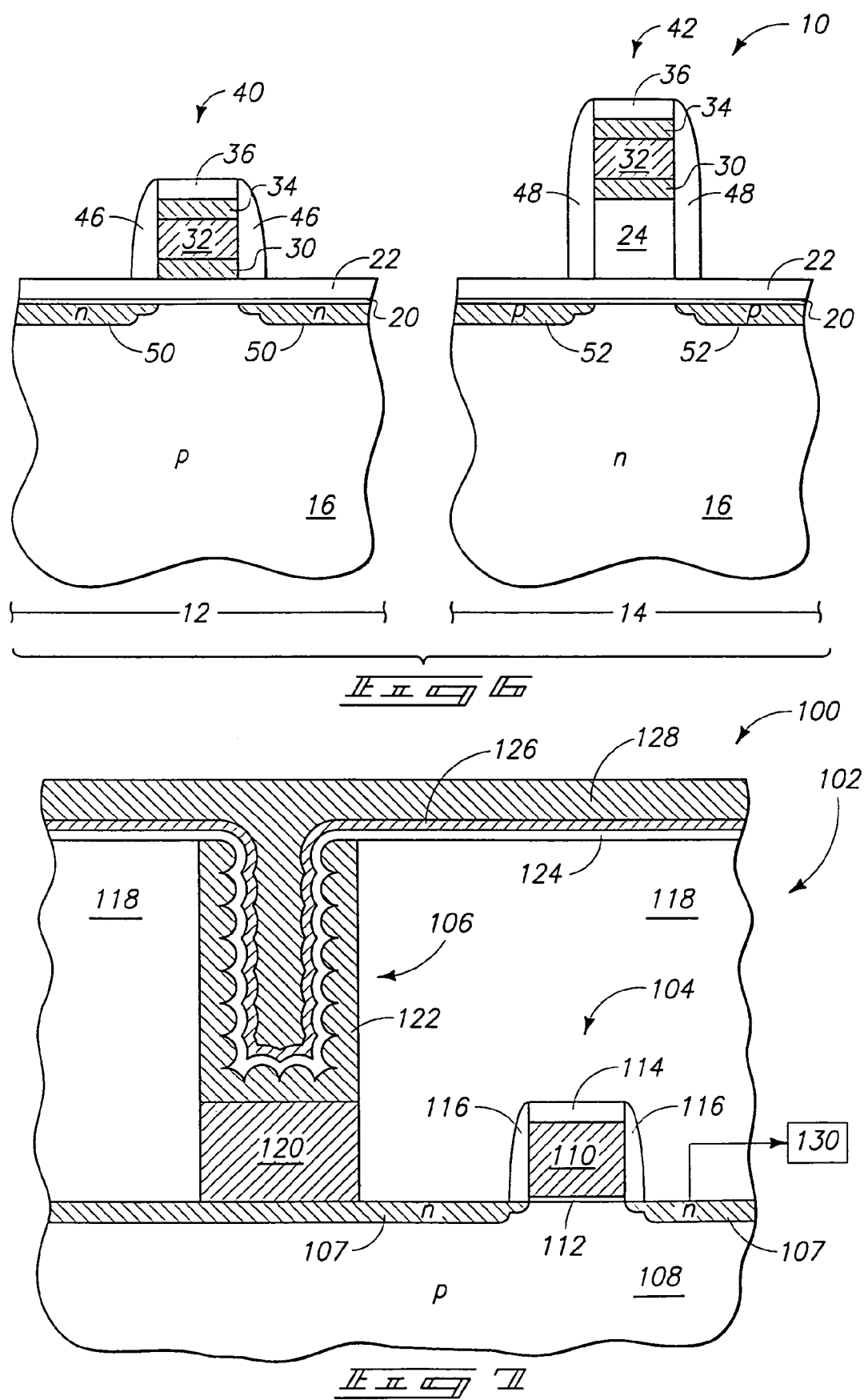

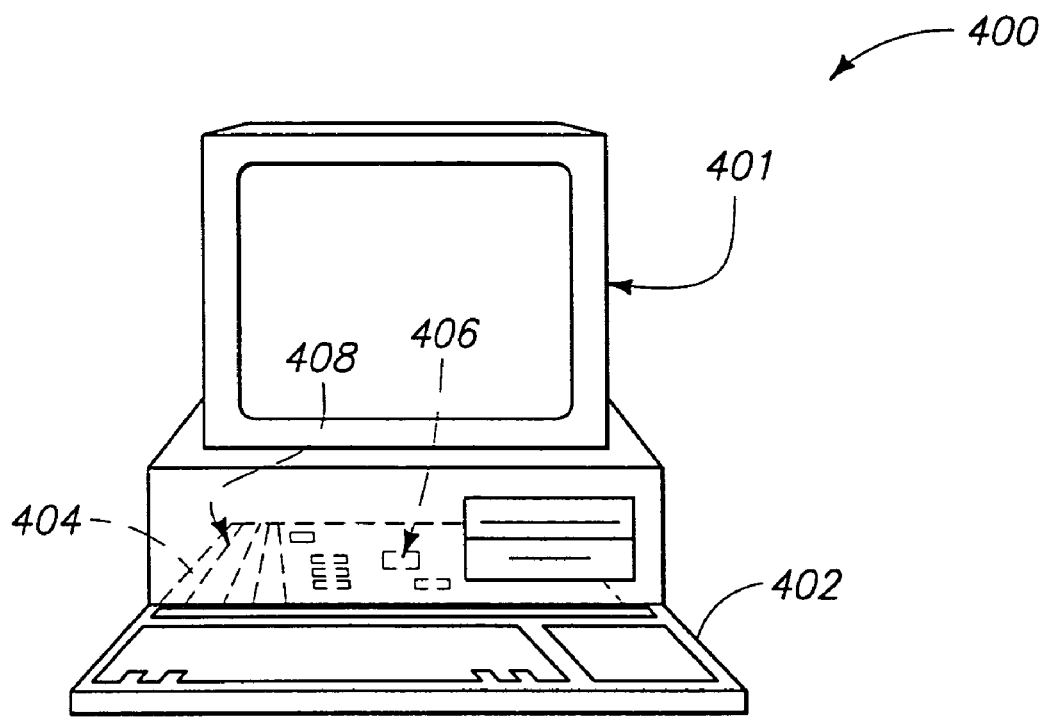
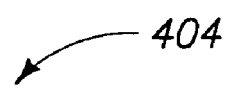
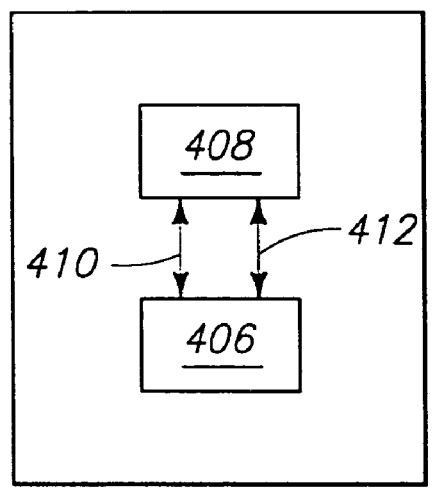

METHODS OF FORMING TRANSISTOR DEVICES AND CAPACITOR CONSTRUCTIONS

RELATED PATENT DATA

This patent resulted from a divisional application of U.S. patent application Ser. No. 10/388,103, which was filed Mar. 12, 2003.

TECHNICAL FIELD

The invention pertains to transistor devices (including n-channel metal-oxide semiconductor (NMOS) devices and p-channel metal oxide semiconductor (PMOS) devices), and complementary metal-oxide semiconductor (CMOS) constructions. The invention also pertains to methods of making capacitor devices, transistor devices, and CMOS constructions. In particular aspects, the invention pertains to memory storage comprising transistor devices, capacitor constructions and/or CMOS assemblies, and in some aspects the invention pertains to dynamic random access memory (DRAM). In particular aspects, the invention pertains to electronic systems comprising capacitor constructions, transistor devices and/or CMOS assemblies.

BACKGROUND OF THE INVENTION

There can be advantages associated with the utilization of high-k gate dielectrics in various semiconductor constructions, including, for example, transistor devices and capacitor devices. High-k dielectrics are understood to be dielectric materials having a dielectric constant greater than that of silicon dioxide, and can include, for example, $Ta_2O_5$, $Al_2O_3$, and numerous other materials.

There has been some interest in attempting to integrate high-k dielectric materials into standard CMOS flow. However, such presents several difficulties when utilized in conjunction with the silicon gate electrodes typical of CMOS constructions. For instance, direct deposition of silicon (such as, for example, polycrystalline silicon) on high-k gate dielectric films typically results in a reaction layer at the interface of the silicon and the dielectric. The reaction layer can occur during the silicon deposition, and/or during subsequent high-temperature annealing of the silicon. The reaction layer generates an interfacial film, such as a silicate, between the silicon and the dielectric material. This interfacial layer reduces the effective dielectric constant of the dielectric stack, and thus limits the scalability of the dielectric. Further, the interfacial layer can be a source of charge trapping/fixed charge, due in part to metal-atom d states and charged atom defects. The charge trapping/fixed charge can be affected by post-gate annealing, and can result in uncontrollable shifts in a threshold voltage of a transistor device. In addition, the threshold voltage can shift due to boron diffusion from a p-type conductively doped silicon into a high-gate dielectric. Such threshold voltage shifts can be particularly significant and problematic for high thermal budget processing, such as, for example, memory cell processing. The boron diffusion through the dielectric can be a problem in spite of the thickness increase of the dielectric associated with utilization of a high permittivity film.

For the above-discussed reasons, it would be desirable to develop new methods for incorporating high-k dielectric materials into CMOS flow. Additionally, since high-k dielectric materials are utilized in other semiconductor constructions besides CMOS assemblies, it would be desirable if the methodologies could be applicable to other semiconductor fabrication besides CMOS flow, and particularly if the methodologies could be applicable to capacitor device fabrication. Also, it would be desirable if the methodologies could be applied not only to high-k dielectric materials, but also to other dielectric materials.

SUMMARY OF THE INVENTION

In one aspect, the invention encompasses a method of forming a circuit device. A dielectric layer is formed over a substrate, and a metal-containing material (such as, for example, a material comprising elemental metal, metal silicide, and/or metal nitride; with the metal being, for example, one or more of tungsten, hafnium, tantalum and titanium) is formed directly on the dielectric layer. The metal-containing material is formed to a thickness of no more than about 20 Å. Subsequently, conductively-doped silicon is formed directly on the metal-containing material. The circuit device can be, for example, a transistor device or a capacitor device.

In another aspect, the invention encompasses a method of forming a transistor device. A gate dielectric is formed over a substrate. A metal-containing material is formed over the dielectric, with the metal-containing material being formed to a thickness of no more than about 20 Å. Conductively-doped silicon is formed over the metal-containing material, and subsequently the metal-containing material and conductively-doped silicon are patterned into a gate stack. Source/drain regions are then provided proximate the gate stack.

In another aspect, the invention encompasses a CMOS. The CMOS includes a dielectric layer over a substrate. A PMOS gate and an NMOS gate are over the dielectric layer. A first metal-containing material is within the PMOS gate and over the dielectric layer, with the first metal-containing material having a thickness of greater than 20 Å, and more typically greater than 150 Å. A second metal-containing material is within the NMOS gate and over the dielectric layer, with the second metal-containing material having a thickness of less than or equal to about 20 Å. A first layer of n-type doped silicon is within the PMOS gate and over the first metal-containing material, and a second layer of n-type doped silicon is within the NMOS gate and over the second metal-containing material.

In another aspect, the invention encompasses a capacitor construction. The construction includes a first capacitor electrode which comprises conductively-doped silicon. A dielectric layer is proximate the first capacitor electrode, and a second capacitor electrode is across the dielectric layer from the first capacitor electrode. A metal-containing material is between the conductively-doped silicon of the first capacitor electrode and the dielectric layer. The metal-containing material has a thickness of less than or equal to about 20 Å.

The various constructions of the invention can be incorporated into memory devices, such as, for example, DRAM devices. Also, the various constructions of the present invention can be incorporated into electronic systems.

BRIEF DESCRIPTION OF THE DRAWINGS

Preferred embodiments of the invention are described below with reference to the following accompanying drawings.

FIG. 6 is a view of the FIG. 2 wafer fragments shown at a processing stage subsequent to that of FIG. 5.

FIG. 7 is a diagrammatic, fragmentary, cross-sectional view of a semiconductor wafer fragment in accordance with another embodiment of the invention, and illustrates a DRAM cell.

FIG. 8 is a diagrammatic view of a computer illustrating an exemplary application of the present invention.

FIG. 9 is a block diagram showing particular features of the motherboard of the FIG. 8 computer.

DETAILED DESCRIPTION OF THE PREFERRED EMBODIMENTS

Figure 1:
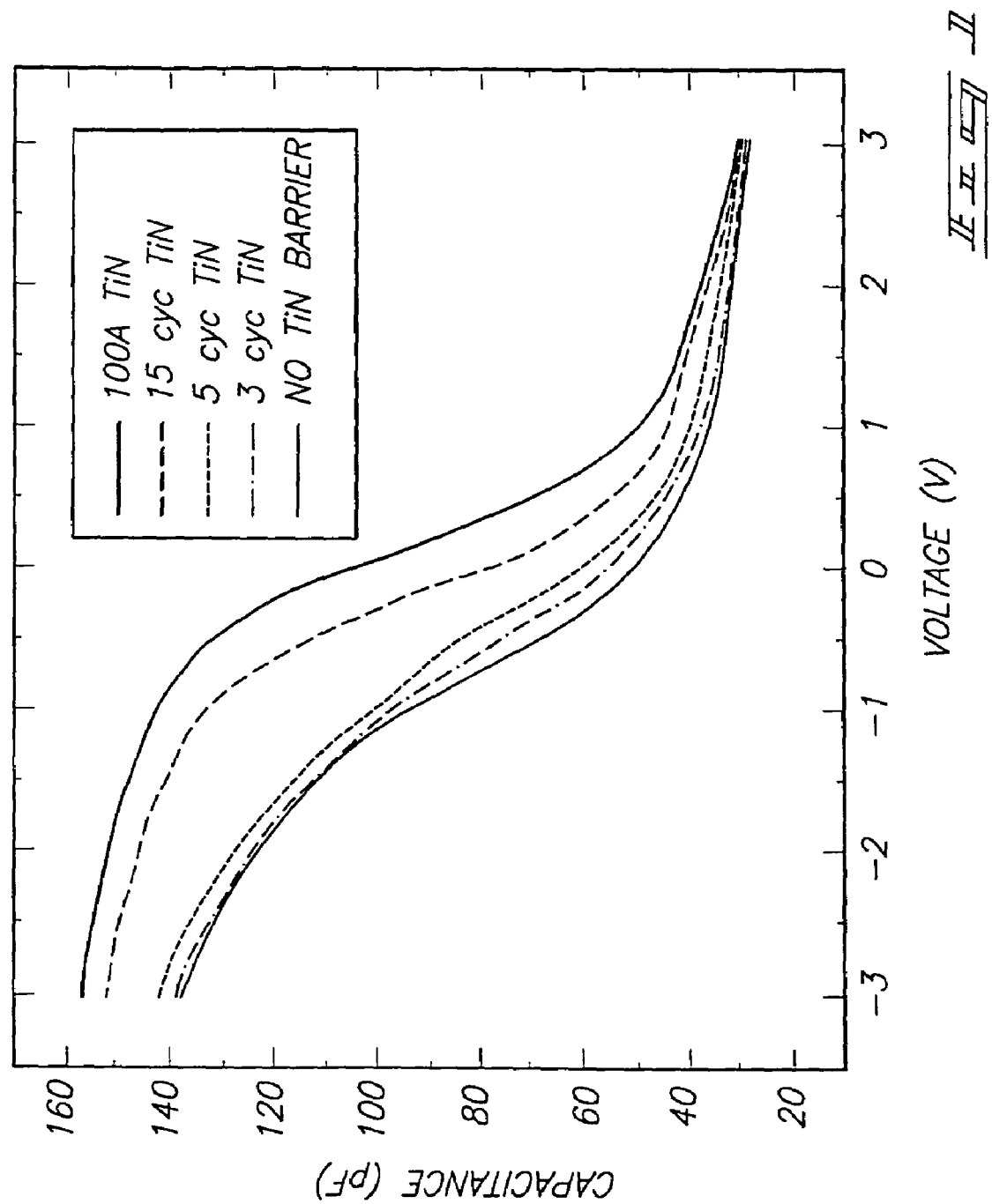
FIG. 1 is a graph of capacitance (in picofarads) versus voltage for various constructions comprising atomic layer deposited (ALD) titanium nitride between aluminum oxide and polycrystalline silicon. The thickness of the titanium nitride layer is described in an inset of the graph, which indicates either that no titanium layer was present, that a particular number of ALD cycles were utilized in forming a titanium nitride layer, or that a 100 Å thick titanium nitride layer is present. Each ALD cycle corresponds to a growth rate of titanium nitride of from about 0.3 Å to about 0.4 Å.

This disclosure of the invention is submitted in furtherance of the constitutional purposes of the U.S. Patent Laws "to promote the progress of science and useful arts" (Article 1, Section 8).

One aspect of the invention is a recognition that it can be advantageous to incorporate a metal-containing material between dielectric material and conductively-doped silicon in both the NMOS and PMOS devices of CMOS constructions. Further, it is recognized that it can be advantageous if the metal-containing material utilized in the PMOS devices is substantially thicker than the metal-containing material utilized in the NMOS devices (with the metal-containing material in the PMOS devices having a thickness greater than 20 Å, frequently greater than 100 Å, and even greater than or equal to 150 Å), while the metal-containing material utilized in the NMOS devices is thin. The metal-containing material utilized in the NMOS devices is typically no greater than 20 Å, frequently less than or equal to 15 Å, and even less than or equal to 10 Å. Alternatively considered, the metal-containing material utilized in the NMOS devices is typically formed of no more than 70 atomic layer deposition (ALD) cycles, frequently less than 50 ALD cycles, and even less than 40 ALD cycles; with typical ALD utilized in applications of the present invention comprising a deposition rate of from about 0.3 to about 0.4 angstroms per cycle. It is to be understood, however, that the invention can utilize ALD having a different deposition rate than from about 0.3 to about 0.4 angstroms per cycle. The metal-containing layer utilized in the NMOS devices can be discontinuous due to the thinness of the layer, and still be suitable for particular applications of the invention.

The metal-containing material can, in particular aspects, comprise titanium, hafnium, tantalum or tungsten. Exemplary metal-containing materials comprise, consist essentially of, or consist of one or more of elemental titanium, elemental hafnium, elemental tantalum and elemental tungsten; and/or one or more of nitrides and suicides of one or more of titanium, tantalum, hafnium and tungsten. In some aspects, it can be desirable for the metal-containing material to comprise, consist essentially of, or consist of one or more of tantalum nitride, tungsten nitride, hafnium nitride and titanium nitride.

In particular applications, utilization of a metal-containing material between a dielectric material and boron-doped polysilicon can alleviate, and even prevent, boron out-diffusion into the dielectric material. Also, particular metal-containing materials can be chosen such that similarity between the metal-containing materials and the p-type silicon work functions result in a negligible shift of the threshold voltage of the PMOS devices, (with exemplary suitable metal-comprising materials being titanium nitride and tungsten nitride). Further, utilization of such metal-containing materials between a high-k dielectric and a polysilicon material can alleviate, and even prevent, formation of a silicate interfacial layer, such as a silicate, that could otherwise occur if the silicon directly contacted the dielectric material.

Although metal-comprising materials having work functions similar to p-type doped silicon can be excellent for utilization in PMOS gates, the work functions of such metal-comprising materials can be problematic in NMOS gates. For instance, titanium nitride is a metal-comprising material having a work function similar to p-type doped silicon, and a thick layer of titanium nitride will shift the NMOS threshold voltage by approximately one volt relative to a gate lacking titanium nitride. This problem can be avoided by utilizing a metal-comprising material in the NMOS gates which has a different work function than that utilized in the PMOS gates. However, metals with low work functions, which would be suitable substitutes for n-type silicon, also tend to be highly unstable at elevated temperatures. Such metals are therefore unsuitable for typical thermal processing conditions utilized during semiconductor device fabrication.

One aspect of the present invention is utilization of a very thin metal-containing material barrier layer (several monolayers or less thick) within an NMOS device, with the material having a work function substantially different than that of n-type silicon. The metal-containing material is placed between silicon and a dielectric material (such as a high-k dielectric like aluminum oxide). Preferably the metal-containing material is thin enough to avoid completely dominating the combined work function of the n-type silicon and the metal-containing material, and yet sufficiently thick to alleviate, and even prevent, reaction of the silicon with the dielectric material. By alleviation of the reaction of the silicon and dielectric material, a prior art problem of charge trapping at an interface of the silicon and high-k dielectric materials can be avoided, which can make the threshold voltage of the NMOS devices more controlled.

The thin metal-containing material barrier layer utilized in the NMOS devices can be formed by any suitable method, including, for example, atomic layer deposition (ALD) and/or chemical vapor deposition (CVD). Atomic layer deposition can be preferred, in that such can enable excellent control of the thickness and uniformity of the metal-containing material, and also can alleviate, and even prevent, damage to and interaction with a subsurface dielectric which is in direct physical contact with the metal-containing material.

The metal-containing material is typically formed directly on the dielectric material. The term "directly on" means that the metal-containing material is formed in physical contact with the dielectric material if formed by CVD, or that a layer utilized in formation of the metal-containing material is deposited in physical contact with the dielectric material if the process is ALD. In some aspects, an interfacial layer can be formed over the bulk of the dielectric material prior to forming the bulk of the metal-containing material, and the metal-containing material can be formed on the interfacial layer. The interfacial layer can comprise, for example, a nitride, such as silicon nitride or hafnium nitride. The nitride can be formed by, for example, nitridation of a surface particular dielectric materials.

The silicon formed over the metal-containing material can be formed by any suitable method, including, for example, chemical vapor deposition. The conductivity-enhancing dopant can be formed within the silicon during the deposition, or with a suitable implant following the deposition.

Formation of the silicon directly on the metal-containing material (with the term "directly on" indicating that the silicon is formed in physical contact with the metal-containing material if the process is chemical vapor deposition) can enable the silicon and metal-containing material to react to form a composite material containing metal and silicon, such as, for example, a material comprising titanium, nitrogen and silicon ($TiN_xSi_y$, where x and y are greater than zero); hafnium, nitrogen and silicon; tungsten, nitrogen and silicon; or tantalum, nitrogen and silicon. If the composite material comprises titanium, nitrogen and silicon, such material can have a work function intermediate that of titanium silicide and titanium nitride. The literature indicates that the respective work functions of titanium silicide and titanium nitride are in the ranges of 3.67 to 4.25 electron volts and 4.83 to 4.95 electron volts, respectively.

FIG. 1 illustrates high frequency capacitance/voltage data showing the effect of atomic layer deposited titanium nitride barrier thickness on flat band voltage (Vfb). The 100 Å thick titanium nitride barrier exhibits the work function of bulk titanium nitride, and has been shown in flash transistor experiments to match the PMOS threshold voltage. Thinning of the titanium nitride film to 15 ALD cycles (estimated to be approximately 5 Å to about 7 Å thick) shifts the Vfb by a negative 300 millivolts. In addition, a Vfb shift may be possible with further thinning of the titanium nitride barrier. The data in FIG. 1 shows that five cycles of atomic layer deposited titanium nitride has no appreciable effect relative to utilization of the titanium nitride on aluminum oxide. In fact, the capacitance/voltage curve of titanium nitride formed from three cycles and titanium nitride formed from five cycles are identical to that of a polysilicon gate formed directly on aluminum oxide without an intervening titanium nitride barrier. The stretched out capacitance/voltage curve indicates an increase in interface states. This, along with reduction in accumulation capacitance, supports formation of an interfacial silicate layer in the absence of titanium nitride, or in the presence of titanium nitride formed from five or fewer ALD cycles (with the shown ALD cycles corresponding to a growth rate of from about 0.3 Å to about 0.4 Å of titanium nitride per cycle).

Figure 2:
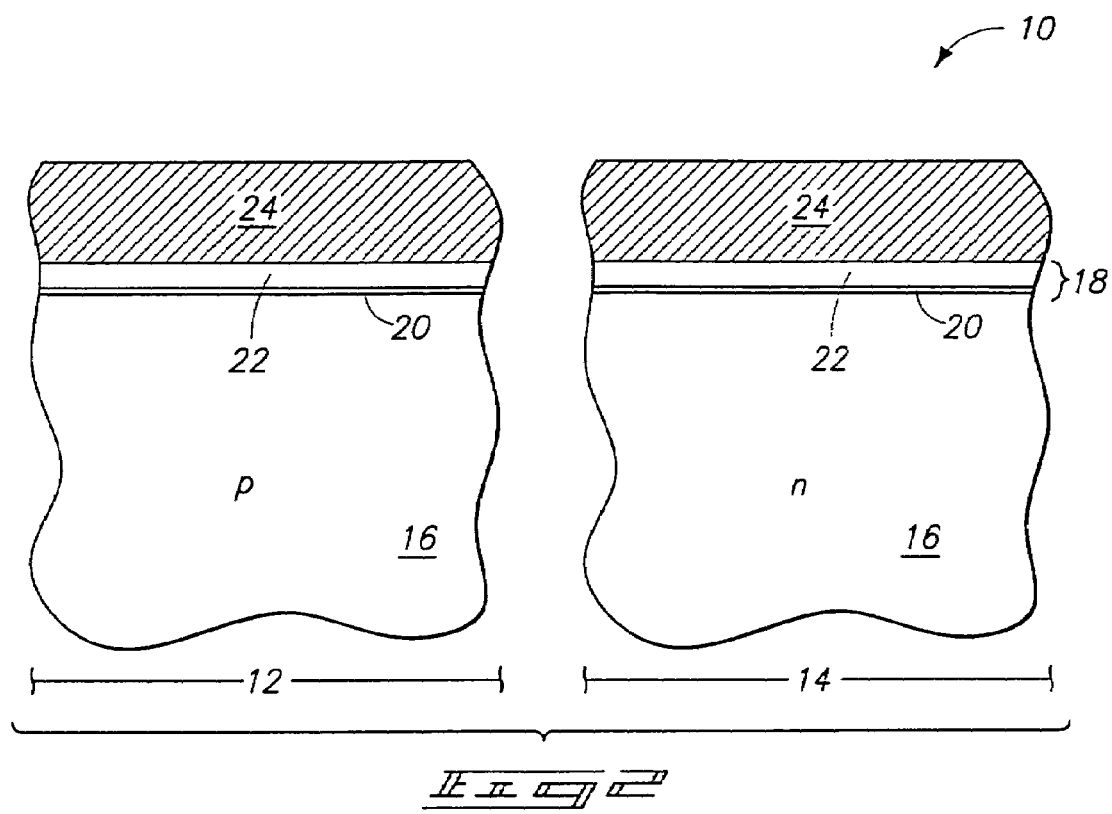
FIG. 2 is a diagrammatic, fragmentary view of a semiconductor wafer construction at a preliminary processing stage, and illustrates a pair of fragments of the wafer construction.

An exemplary aspect of the invention is described with reference to FIGS. 2-7. Referring initially to FIG. 2, a semiconductor construction 10 is illustrated to comprise a first fragment 12 and a second fragment 14. Fragments 12 and 14 correspond to an NMOS region and a PMOS region, respectively, and can be together incorporated into a CMOS construction.

Construction 10 comprises a substrate 16, with the substrate being p-type doped in NMOS region 12, and n-type doped in PMOS region 14. Substrate 16 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A dielectric material 18 extends over substrate 16. Dielectric material 18 is shown to comprise a pair of separate layers, with a lower thin layer 20 being formed directly on an upper surface of substrate 16 and an upper thicker layer 22 being formed on thin layer 20. Thin layer 20 can comprise, for example, silicon dioxide, and can, in particular applications, correspond to a native oxide formed over an upper surface of a monocrystalline substrate 16. Dielectric material 22 can correspond to any suitable dielectric material, including, for example, a high-k dielectric material. Layer 22 can, for example, comprise one or more oxides, and/or one or more silicates. In particular applications, layer 22 will comprise one or more of tantalum, hafnium and aluminum. The layer can, for example, comprise an oxide of tantalum, (such as $Ta_2O_5$), an oxide of aluminum (such as $Al_2O_3$), hafnium oxide and/or hafnium silicate; and in some applications can comprise multilayers of different materials (for example, $Al_2O_3/HfO_2$, etc.). The multilayers can be, for example, nanolaminates. Although dielectric material 18 is shown comprising two separate layers, it is to be understood that the material can comprise a single layer, or can comprise more than two separate layers. In particular processing, silicon dioxide layer 20 can be omitted, and a high-k dielectric material can be utilized for the entirety of dielectric layer 18. In other aspects, the entirety of the dielectric material can be something other than high k material, such as, for example, silicon dioxide.

A layer 24 of metal-containing material is formed over dielectric material 22, and in the shown embodiment is formed physically against dielectric material 22, or in other words is formed directly on dielectric material 22. Metal-containing layer 24 can be referred to as a thick metal-containing layer, or a first metal-containing layer, to distinguish layer 24 from a metal-containing layer which will be formed subsequently. Metal-containing layer 24 can be formed by any suitable method, including, for example, chemical vapor deposition. The metal of layer 24 can comprise, for example, titanium, tantalum, tungsten or hafnium. In particular aspects, layer 24 can comprise, consist essentially of, or consist of elemental hafnium, titanium, tantalum and tungsten; or can comprise, consist essentially of, or consist of nitrides and/or suicides of one or more of titanium, tantalum, tungsten and hafnium. Layer 24 is formed to a thickness of greater than 20 Å, and typically will be formed to a thickness of greater than 100 Å, such as, for example, a thickness of greater than or equal to 150 Å.

Figure 3:
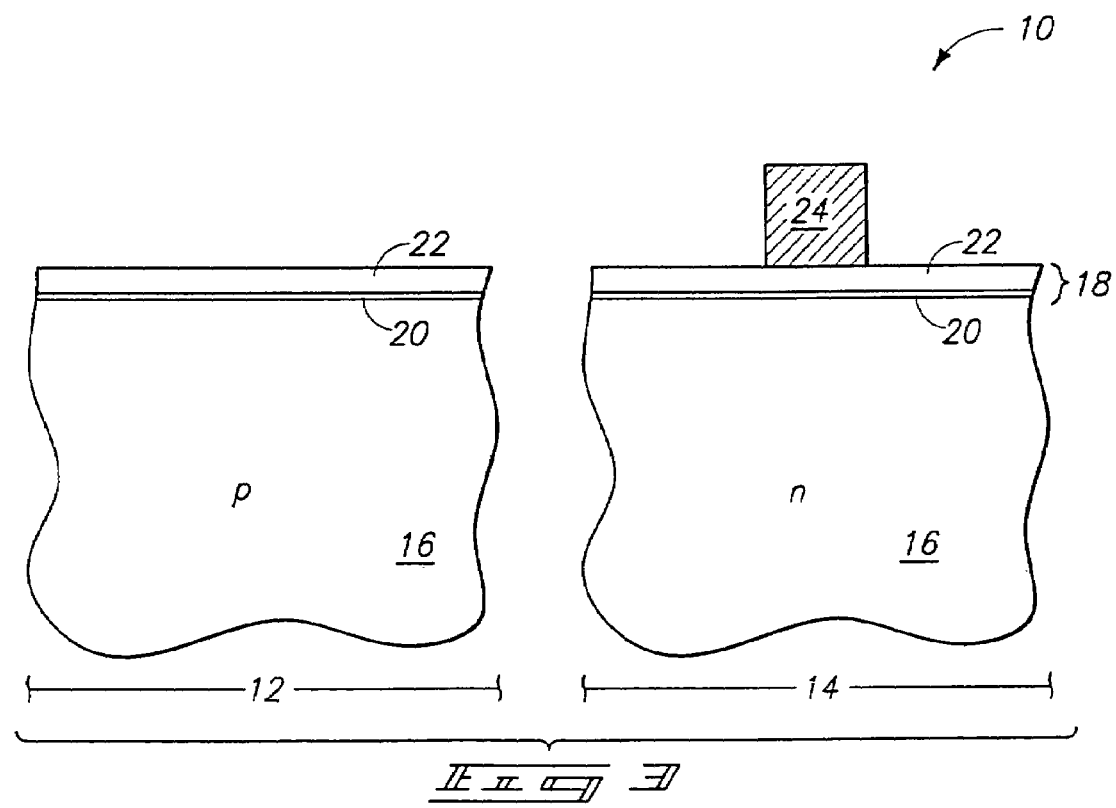
FIG. 3 is a view of the FIG. 2 wafer fragments shown at a processing stage subsequent to that of FIG. 2.

Referring to FIG. 3, layer 24 is patterned so that the material of layer 24 is over PMOS region 14, and not over NMOS region 12. The patterning of layer 24 forms the material of the layer into a block. Such patterning can be accomplished by, for example, photolithographic processing to form a patterned photoresist mask (not shown) over layer 24, a suitable etch of layer 24 to transfer a pattern from the mask to the layer, and subsequent stripping of the photoresist mask. The procedure shown in FIGS. 2 and 3 is but one of several methods that can be utilized for forming a metal-containing material block (the portion of layer 24 remaining in FIG. 3) to be over PMOS region 14 and not over NMOS region 12.

Figure 4:
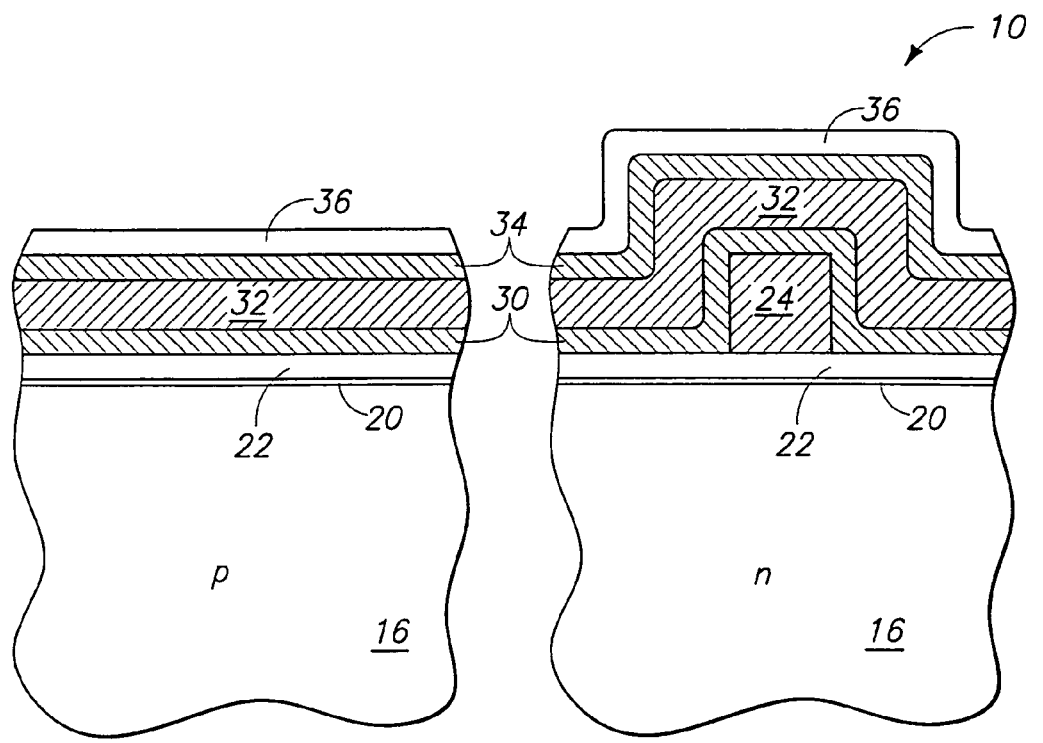
FIG. 4 is a view of the FIG. 2 wafer fragments shown at a processing stage subsequent to that of FIG. 3.

Referring to FIG. 4, a stack of layers 30, 32, 34 and 36 is formed over NMOS region 12 and PMOS region 14. Layer 30 comprises a metal-containing material, and is formed to a thickness of less than or equal to about 20 Å. Layer 30 can be referred to as a second metal-containing layer to distinguish the layer from the first metal-containing layer 24. In the shown aspect of the invention, layer 30 is formed physically against dielectric material 22 across the NMOS region 12, and is formed physically against first metal-containing layer 24 across PMOS region 14. Metal-containing layer 30 can be formed by, for example, atomic layer deposition, and can be formed to a thickness of less than or equal to about 15 Å, and in particular aspects can be formed to a thickness of less than or equal to about 10 Å; alternatively, the layer can be formed with less than or equal to about 50 ALD cycles, or less than or equal to about 30 ALD cycles. Second metal-containing layer 30 can have the same composition as first metal-containing layer 24, or a different composition. Metal-containing layer 30 can predominantly comprise titanium nitride (i.e., more than 50% of metal-containing layer 30, by weight, can be titanium nitride). Metal-containing layer 30 can alternatively predominately comprise tantalum nitride, tungsten nitride or hafnium nitride. In particular aspects, layer 30 can comprise, consist of, or consist essentially of, one or more of elemental titanium, tantalum, tungsten and hafnium; and can comprise, consist essentially of, or consist of nitrides and/or suicides of one or more of titanium, tantalum, tungsten and hafnium.

Layer 32 comprises, consists essentially of, or consists of conductively-doped silicon (such as, for example, conductively-doped amorphous silicon or conductively-doped polycrystalline silicon). In the shown aspect of the invention, silicon-containing layer 32 is physically against metal-containing layer 30. Also, in the shown aspect of the invention, the same conductively-doped silicon layer extends across both the NMOS and PMOS regions. Accordingly, if conductively-doped layer 32 is majority n-type doped, such material is utilized in both the NMOS and PMOS regions. It is to be understood that the invention can encompass other aspects (not shown) in which a different conductively-doped material is utilized for the PMOS region relative to the NMOS region, or in which conductively-doped silicon material is omitted from one of the NMOS and PMOS regions. However, the shown aspect of the invention can be preferred, in that it can simplify processing if the same conductively-doped silicon is formed across both the NMOS and PMOS regions of a substrate.

Layer 34 can comprise, for example, metal and/or metal alloy, and in particular aspects will comprise tungsten.

Layer 36 can comprise an electrically insulative cap, such as, for example, silicon nitride.

Figure 5:
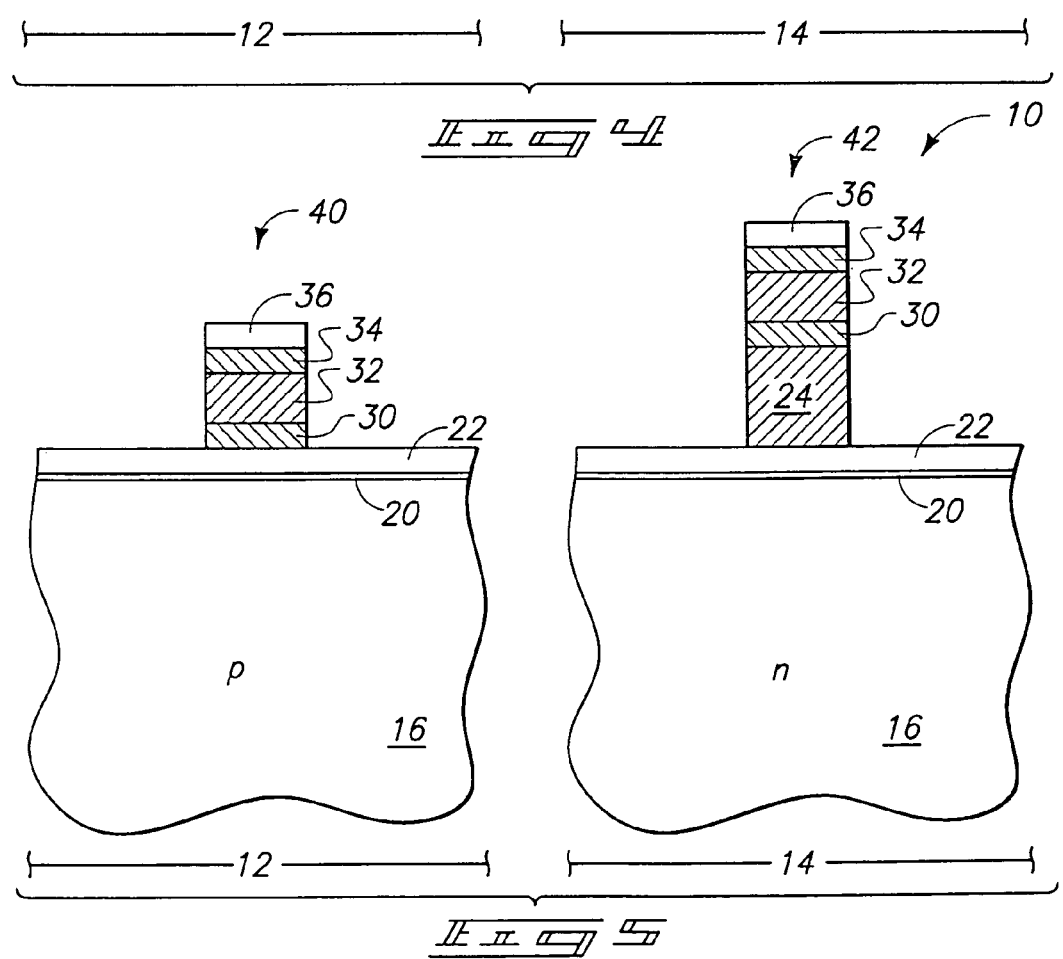
FIG. 5 is a view of the FIG. 2 wafer fragments shown at a processing stage subsequent to that of FIG. 4.

Referring to FIG. 5, layers 30, 32, 34 and 36 are patterned to form gate stacks 40 and 42 over NMOS region 12 and PMOS region 14, respectively. The patterned materials of stacks 40 and 42 can be referred to as first and second materials, respectively, to distinguish the materials within the particular stacks. For instance, the patterned silicon layer 32 can be referred to as first silicon material in stack 40 and a second silicon material in stack 42.

A notable difference between stacks 40 and 42 is that gate stack 40 has only the thin metal-containing material of layer 30 between conductively-doped silicon layer 32 and dielectric material 22, whereas gate stack 42 has thick metal-containing material of layer 24 between the conductively-doped silicon layer 32 and the dielectric material 22, in addition to the thin metal-containing material of layer 30.

Preferably, the metal-containing material between conductively-doped silicon layer 32 and dielectric material 22 in gate stack 42 is thick enough so that a work function of gate stack 42 is equivalent to that of the pure metal-containing material alone. In contrast, the metal-containing material within gate stack 40 is preferably thin enough so that a work function of stack 40 is not that of pure metal-containing material, but instead is modulated by the conductively-doped silicon of layer 32. However, the metal-containing material of layer 30 is preferably thick enough so that the work function of stack 40 is not that of pure conductively-doped silicon of layer 32 either, but is instead between the work functions of the pure metal-containing material and the pure conductively-doped silicon. In particular aspects, a work function of conductively-doped silicon layer 32 and the metal-containing material layer 30, together in NMOS stack 40, is shifted relative to the work functions of the conductively-doped silicon and metal-containing material in pure form, and is shifted from the work function of the metal-containing material in pure form by at least 50 millivolts.

In applications in which the work function of NMOS gate stack 40 comprises a contribution from conductively-doped silicon of layer 32, the majority dopant type of material 32 will typically be n-type.

Since the work function of PMOS gate stack 42 is effectively that of metal-containing material 24, the conductivity-type doping of silicon layer 32 is irrelevant relative to the work function of the gate stack. Accordingly, PMOS gate stack 42 can comprise either n-type silicon or p-type silicon for layer 32. It can, however, be preferred that the gate stack utilize n-type silicon as the silicon of stack 42. Silicon of stack 42 can then be formed in a single step with the silicon of stack 40, as shown in the processing of FIG. 4.

The formation of gate stack 40 from layers 30, 32, 34 and 36 can be considered to be incorporation of materials of such layers into an NMOS gate stack. Similarly, the formation of gate stack 42 from layers 24, 30, 32, 34 and 36 can be considered to be incorporation of materials of such layers into a PMOS gate stack.

The regions under gate stacks 40 and 42 can be, in particular aspects of the invention, referred to as an NMOS gate region and a PMOS gate region, respectively. Also, the dielectric materials 20 and 22 beneath gate stacks 40 and 42 can be considered to be a gate dielectric layer in particular aspects of the invention.

The silicon of layer 32 which contacts metal-containing layer 30 can react with the metal-containing material in various aspects of the invention to form a composition comprising metal, silicon, and possibly nitrogen, at the interface of the silicon and the metal-containing material. Such composition can have a work function intermediate that of a metal silicide and a metal-containing material, and in the case of the NMOS gate 40, such work function can ultimately influence the total work function of the gate stack.

Referring to FIG. 6, sidewall spacers 46 and 48 are formed along sidewalls of gate stacks 40 and 42, respectively. Spacers 46 and 48 can comprise any suitable insulative material, including, for example, one or both of silicon nitride and silicon dioxide, and can be formed by, for example, deposition of an appropriate material followed by an anisotropic etch of the material.

N-type source/drain regions 50 are formed within substrate 16 proximate gate stack 40 to complete formation of an NMOS transistor device, and p-type source/drain regions 52 are formed within substrate 16 proximate gate stack 42 to complete formation of a PMOS transistor device. Source/drain regions 50 and 52 can be formed by any suitable method, including, for example, various implants occurring before and/or after formation of sidewall spacers 46 and 48.

Although the processing of FIGS. 2-6 is described with reference to formation of an NMOS transistor and a PMOS transistor (i.e., formation of a CMOS structure), it is to be understood that various aspects of the invention can be utilized for formation of a single transistor. For instance, an NMOS transistor of the type shown in FIG. 6 can be formed alone for incorporation into various circuit devices.

The processing described above for formation of the NMOS transistor device can be utilized for formation of other devices, including, for example, a capacitor device. Such is illustrated with reference to FIG. 7, which shows a construction 100 containing a DRAM unit cell 102. The DRAM unit cell comprises a transistor construction 104 having source/drain regions 107 electrically connected to a capacitor construction 106 and a bitline 130.

Transistor construction 104 is shown as an NMOS construction. Accordingly, source/drain regions 107 are n-type doped regions. The source/drain regions extend into a p-type substrate 108. Substrate 108 can comprise any suitable construction, including, for example, monocrystalline silicon. Transistor device 104 further comprises a conductive gate 110 separated from substrate 108 by a gate dielectric 112. Gate dielectric 112 can comprise any suitable material, including, for example, silicon dioxide and/or high-k dielectric materials. Conductive gate material 110 can comprise any suitable material, or combination of materials. In particular aspects, the NMOS transistor device of FIG. 7 will correspond to the NMOS device shown in FIG. 6, and accordingly gate 110 will comprise the layers 30, 32 and 34. In other aspects, gate 110 can comprise a conventional construction.

An insulative cap 114 is formed over conductive gate material 110, and insulative sidewall spacers 116 are formed along sidewalls of the conductive gate material. Cap 114 and spacers 116 can comprise any suitable materials, including, for example, one or both of silicon dioxide and silicon nitride.

An electrically insulative material 118 extends over and around transistor device 104. Insulative material 118 can comprise one or more suitable materials, including, for example, borophosphosilicate glass (BPSG).

An opening extends through material 118 to one of the source/drain regions 107. A conductive pedestal 120 is within the opening and electrically connected to the source/drain region. The conductive pedestal can comprise any suitable conductive material, including, for example, conductively-doped silicon, metal, and/or metal compounds.

Capacitor construction 106 also extends within the opening in insulative material 118, and electrically connects with conductive pedestal 120. Capacitor construction 106 comprises a storage node 122, a dielectric material 124, and a metal-containing material 126.

Storage node 122 can comprise any suitable conductive material, including, for example, conductively-doped rugged silicon (such as, for example, hemispherical grain silicon).

Dielectric material 124 can comprise any suitable material, including, for example, high-k dielectric materials (such as, for instance, the high k materials described above for dielectric region 18 of FIG. 2), and/or silicon dioxide, and/or a combination of silicon dioxide and silicon nitride. In particular aspects, dielectric material 124 can comprise aluminum oxide and silicon dioxide, with the silicon dioxide being a thin layer (not shown) between conductively-doped silicon of storage node 122 and the aluminum oxide.

Metal-containing material 126 can comprise the same composition as described previously for metal-containing material of layer 30, and can be formed by, for example, ALD or CVD.

Capacitor electrode 128 can comprise, for example, conductively-doped silicon, and such can be either p-type doped or n-type doped. An advantage of utilizing the thin layer of metal-containing material 126 in combination with conductively-doped silicon of capacitor plate 128 can be to enable control and manipulation of the work function of a stack comprising materials 126 and 128.

Although metal-containing material 126 is shown between dielectric material 124 and second capacitor electrode 128, it is to be understood that the metal-containing material could alternatively, and/or additionally, be formed between the dielectric material and the capacitor storage node 122.

A circuit device comprising rugged semiconductor material formed in accordance with methodology of the present invention can be utilized in numerous assemblies, including, for example, computer systems and other electronic systems.

FIG. 8 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the transistor devices, CMOS structures, capacitor structures and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 9. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 10:
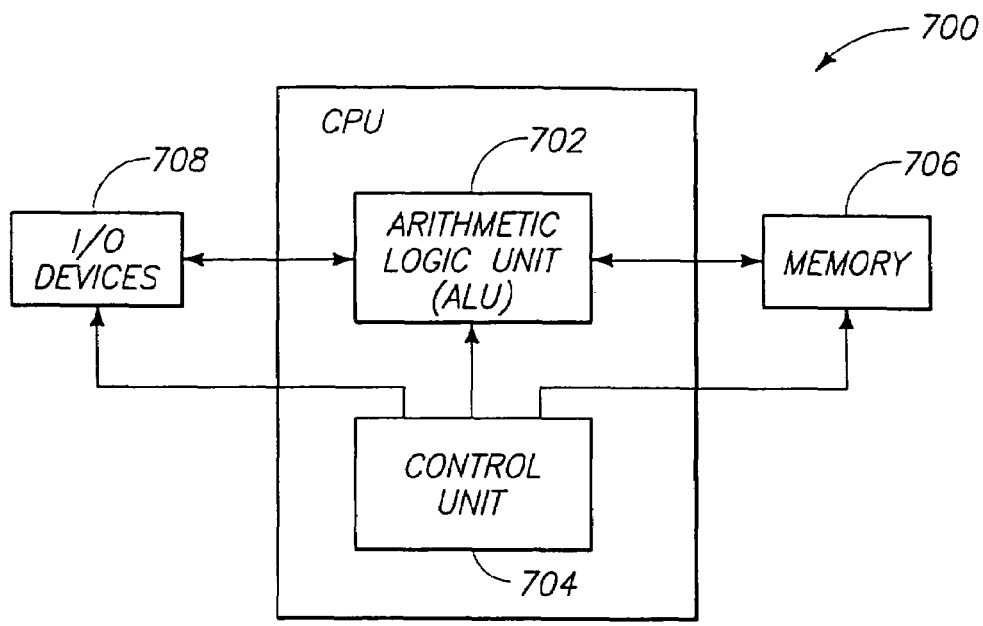
FIG. 10 is a high-level block diagram of an electronic system according to an exemplary aspect of the present invention.

FIG. 10 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include components in accordance with various aspects of the present invention.

Figure 11:
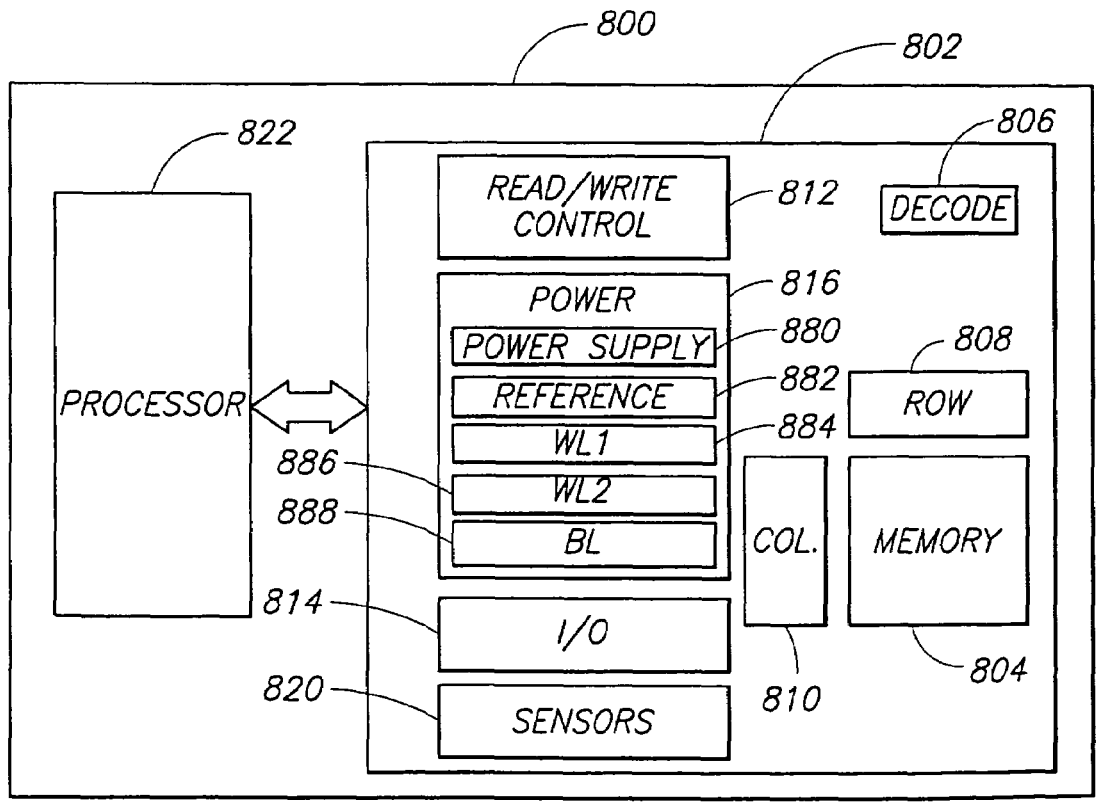
FIG. 11 is a simplified block diagram of an exemplary electronic system according to an aspect of the present invention.

FIG. 11 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell, CMOS, capacitor or transistor of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a PMOS device and an NMOS device, comprising:
    providing a substrate comprising a PMOS gate region and an NMOS gate region;
    forming a gate dielectric layer over the PMOS and NMOS gate regions of the substrate;
    forming a thick metal-containing material to be over the PMOS gate region and not over the NMOS gate region, the thick metal-containing material being formed to a thickness of greater than 20 Å;
    forming a thin metal-containing material to be over the PMOS and NMOS gate regions, the thin metal-containing material being formed to a thickness of less than or equal to about 20 Å and being formed over the thick metal-containing material over the PMOS gate region;
    forming a layer of conductively-doped silicon extending across the PMOS and NMOS gate region and over the thin metal-containing material;
    incorporating the thick metal-containing material, Thin metal-containing material and conductively-dope silicon into a PMOS transistor gate stack aver the PMOS gate region; and
    incorporating the thin metal-containing material and conductively-doped silicon into an NMOS transistor gate stack over the NMOS gate region.

2. The method of claim 1 wherein the conductively-doped silicon is majority n-type doped.

3. The method of claim 1 wherein the gate dielectric layer comprises at least one of tantalum, hafnium and aluminum.

4. The method of claim 1 wherein the gate dielectric layer comprises aluminum oxide over silicon dioxide.

5. The method of claim 1 wherein the thin metal-containing material comprises at least one of titanium nitride, tantalum nitride, hafnium nitride and tungsten nitride.

6. The method of claim 1 wherein the thin metal-containing material comprises at least one of titanium suicide, tantalum silicide, hafnium silicide and tungsten suicide.

7. The method of claim 1 wherein the metal of the thin metal-containing material predominately comprises at least one of titanium, tantalum, tungsten and hafnium.

8. The method of claim 1 wherein the thickness of the thin metal-containing material is less than or equal to about 15 Å.

9. The method of claim 1 where in the thickness of the thin metal-containing material is less than or equal to about 10 Å.

10. A method of forming a capacitor construction, comprising:
    forming a dielectric layer over a capacitor storage node;
    forming a metal-containing material over the dielectric Layer, the metal-containing material being formed with less than or equal to about 70 ALD oyoles
    forming conductively-doped silicon over the metal-containing material; and
    wherein the metal-containing material comprises at least one of titanium suicide, tantalum silicide, hafnium suicide and tungsten suicide.

11. The method of claim 10 wherein the conductively-doped silicon is majority n-type doped.

12. The method of claim 10 wherein the dielectric layer comprises at least one of tantalum, hafnium and aluminum.

13. The method of claim 10 wherein the metal-containing material has a thickness of less than or equal to about 20 Å.

14. The method of claim 10 wherein the metal-containing material has a thickness of less than or equal to about 15 Å.

15. The method of claim 10 wherein the metal-containing material has a thickness of less than or equal to about 10 Å.

16. A method of forming a capacitor construction, comprising:
    forming a capacitor electrode comprising conductively-doped silicon;
    providing a metal-containing material between the capacitor electrode and a capacitor dielectric layer, the metal-containing material having a thickness of no more than about 20 Å; and
    wherein the metal-containing material comprises at least one of titanium silicide, tantalum suicide, hafnium suicide and tungsten silicide.

17. The method of claim 16 wherein the conductively-doped silicon is majority n-type doped.

18. The method of claim 16 wherein the dielectric layer comprises at least one of tantalum, hafnium and aluminum.

19. The method of claim 16 wherein the dielectric layer comprises aluminum oxide.

20. The method of claim 16 wherein the thickness of the metal-containing material is less than or equal to about 1 Å.

21. The method of claim 16 wherein the thickness of the metal-containing material is less than or equal to about 10 Å.

* * * * *

UNITED STATES PATENT AND TRADEMARK OFFICE
CERTIFICATE OF CORRECTION

PATENT NO. : 7,253,053 B2
APPLICATION NO. : 10/757253
DATED : August 7, 2007
INVENTOR(S) : Eppich et al.

It is certified that error appears in the above-identified patent and that said Letters Patent is hereby corrected as shown below:

In column 12, line 50 (Approx.), in Claim 1, delete "region" and insert -- regions --, therefor.

In column 12, line 52 (Approx.), in Claim 1, delete "Thin" and insert -- thin --, therefor.

In column 12, line 53 (Approx.), in Claim 1, delete "dope" and insert -- doped --, therefor.

In column 13, line 2, in Claim 6, delete "suicide," and insert -- silicide, --, therefor.

In column 13, line 3, in Claim 6, delete "suicide." and insert -- silicide. --, therefor.

In column 13, line 9, in Claim 9, delete "where in" and insert --wherein --, therefor.

In column 13, line 16, in Claim 10, delete "Layer," and insert -- layer, --, therefor.

In column 13, line 17, in Claim 10, delete "oyoles" and insert -- cycles; --, therefor.

In column 13, line 21, in Claim 10, delete "suicide," and insert -- silicide, --, therefor.

In column 13, line 22, in Claim 10, delete "suicide" and insert -- silicide --, therefor.

In column 13, line 22, in Claim 10, delete "suicide." and insert -- silicide. --, therefor.

In column 14, line 14 (Approx.), in Claim 16, delete "suicide," and insert -- silicide, --, therefor.

In column 14, line 15 (Approx.), in Claim 16, delete "suicide" and insert -- silicide --, therefor.

UNITED STATES PATENT AND TRADEMARK OFFICE
CERTIFICATE OF CORRECTION

PATENT NO. : 7,253,053 B2
APPLICATION NO. : 10/757253
DATED : August 7, 2007
INVENTOR(S) : Eppich et al.

It is certified that error appears in the above-identified patent and that said Letters Patent is hereby corrected as shown below:

In column 14, line 24, in Claim 20, delete "1Å." and insert -- 15Å. --, therefor.

Signed and Sealed this

Twentieth Day of November, 2007

JON W. DUDAS
*Director of the United States Patent and Trademark Office*